(12) United States Patent
Soussan et al.

(10) Patent No.: US 8,440,504 B2
(45) Date of Patent: May 14, 2013

(54) METHOD FOR ALIGNING AND BONDING ELEMENTS AND A DEVICE COMPRISING ALIGNED AND BONDED ELEMENTS

(75) Inventors: Philippe Soussan, Marseilles (FR); Wouter Ruythooren, Haacht (BE); Eric Beyne, Leuven (BE); Koen De Munck, Leuven (BE)

(73) Assignee: IMEC, Leuven (BE)

( * ) Notice: Subject to any disclaimer, the term of this patent is extended or adjusted under 35 U.S.C. 154(b) by 318 days.

(21) Appl. No.: 12/864,871

(22) PCT Filed: Dec. 29, 2008

(86) PCT No.: PCT/EP2008/068328
§ 371 (c)(1),
(2), (4) Date: Jul. 27, 2010

(87) PCT Pub. No.: WO2009/083582
PCT Pub. Date: Jul. 9, 2009

(65) Prior Publication Data
US 2011/0006431 A1   Jan. 13, 2011

Related U.S. Application Data

(60) Provisional application No. 61/017,136, filed on Dec. 27, 2007.

(30) Foreign Application Priority Data

Jan. 29, 2008   (EP) ..................... 08150789

(51) Int. Cl.
*H01L 21/44*   (2006.01)
(52) U.S. Cl.
USPC .................................. 438/109; 257/E21.499

(58) Field of Classification Search .......... 438/107–110, 438/118, 117, 612, 666; 257/777, 686, 685, 257/E21.499
See application file for complete search history.

(56) References Cited

U.S. PATENT DOCUMENTS

| | | |
|---|---|---|
| 4,478,543 A | 10/1984 | Lyon |
| 6,184,587 B1 | 2/2001 | Khandros et al. |
| 6,384,353 B1 | 5/2002 | Huang et al. |

(Continued)

FOREIGN PATENT DOCUMENTS

| | | |
|---|---|---|
| DE | 9107921 U1 | 8/1991 |
| DE | 10 2005 054353 A1 | 8/2006 |

(Continued)

*Primary Examiner* — Hoa B Trinh
(74) *Attorney, Agent, or Firm* — Knobbe Martens Olson & Bear LLP (57) ABSTRACT

The present invention is related to a method for aligning and bonding a first element (1) and a second element (2), comprising:
 obtaining a first element (1) having at least one protrusion, the protrusion having a base portion (12) made of a first material and an upper portion (13) made of a second, deformable material, different from the first material;
 obtaining a second element (2) having a first main surface and second main surface (8) and at least one through-hole between the first and second main surface;
 placing the first and second element onto each other;
 receiving in the through-hole of the second element (2) the protrusion of the first element (1), the protrusion being arranged and constructed so as to extend from an opening of the through-hole in the first main surface to a position beyond an opening of the through-hole in the second main surface (8);
 deforming the deformable portion (13) of the protrusion, such that the deformed portion mechanically fixes the second element (2) on the first element (1).

22 Claims, 5 Drawing Sheets

U.S. PATENT DOCUMENTS

| | | |
|---|---|---|
| 6,577,013 B1 | 6/2003 | Glen et al. |
| 7,964,948 B2 * | 6/2011 | Lee et al. .................. 257/686 |
| 2004/0238933 A1 | 12/2004 | Chen et al. |
| 2006/0012055 A1 | 1/2006 | Foong et al. |
| 2006/0051896 A1 * | 3/2006 | Meadows .................. 438/109 |
| 2007/0281374 A1 * | 12/2007 | Lee et al. .................. 438/14 |

FOREIGN PATENT DOCUMENTS

| | | |
|---|---|---|
| EP | 1320113 A2 | 6/2003 |
| EP | 1320113 B1 | 5/2008 |

* cited by examiner

METHOD FOR ALIGNING AND BONDING ELEMENTS AND A DEVICE COMPRISING ALIGNED AND BONDED ELEMENTS

CROSS-REFERENCE TO RELATED APPLICATIONS

This application is the national phase under 35 U.S.C. §371 of PCT International Application No. PCT/EP2008/068328 which has an International filing date of Dec. 29, 2008, which designates the United States of America and which claims priority to U.S. Provisional Application No. 61/017,136 filed Dec. 27, 2007 and European Application No. 08150789.9 filed Jan. 29, 2008, the disclosures of each of which are hereby incorporated by reference in their entireties.

TECHNICAL FIELD OF THE INVENTION

The present invention relates to a method for aligning and bonding a first element and a second element. The invention also relates to a device comprising a first element and a second element aligned and bonded to the first element.

BACKGROUND OF THE INVENTION

This invention applies to the field of 3D Thin Die Packaging or multiple thin IC dies packaging in semiconductor industry. In currently applied processes and corresponding devices assembly of thin dies is typically performed by welding and/or gluing layers and/or by wire bonding.

In a typical wire bonding process wires are bonded to the stacked dies in order to provide electrical connectivity. The wire bonding process is time consuming, relatively complex, and enables only a limited wiring density between the dies. Furthermore, the wire bonding process results in a structure having an essentially "pyramidal" shape, which reduces the useful area of the dies.

Stacking of multiple dies normally requires high alignment accuracy. Currently the positioning of the dies is accomplished by equipment that is not capable of achieving such high alignment accuracy (typically the alignment error is of an order of magnitude of about 5 µm or more).

In US 2004/0238933 A1 a packaging method for packaging electronic elements is disclosed. The method comprises the provision of a plurality of stud bumps on a substrate by means of a stud bump process to align with a plurality of vias of a stack of electronic elements. The stud bumps respectively pass through the vias and electrically connect the electronic elements, thereby creating multiple levels of substrates aligned by the same stud bumps.

This process and the corresponding device have the disadvantage that the alignment is accomplished for the entire stack of elements and depends on the positions of the stud bumps provided on the substrate. Therefore the known process and device do not allow for different alignment of the electronic elements at the respective levels of elements. On top of that, the pitch between the vertical interconnects is limited by the deformation of the bumps at the base substrate, in practice the bump is deformed by several tens of µm overall, there fore limiting the pitch to more than 50 µm.

In U.S. Pat. No. 6,577,013 B1 a chip-size semiconductor package ("CSP") containing stacked dies is disclosed. The dies are mounted on one another in a stack such that corresponding ones of vias provided in respective dies are aligned. An electrically conductive wire or pin is present in each set of aligned vias and soldered to corresponding ones of the terminal pads. Therefore the CSP disclosed in this document does not allow for an individual alignment of the dies at the respective levels.

In US 2006/0012055 A1 a method of fabricating a semiconductor device is disclosed. The semiconductor device comprises a semiconductor die provided with a plurality of ball bumps, each ball bump having a base portion and a protruding portion. A lead frame is attached to the semiconductor die by placing openings in the frame, that have been provided at positions corresponding to those of the ball bumps, over the protruding portions of the ball bumps and subsequently coining the protruding portion of the ball bump, for instance by a coining tool bit, to form a rivet which provides for bonding and securing the lead frame to the semiconductor die. Instead of coining (pressing) the ball bumps they may be heated. This causes the upper part of the ball bumps to melt and to wet the lead frame such that upon cooling the bumps provide for riveting of the lead frame. The ball bumps are either solder bumps or formed by electroplating fabrication and may for instance be made of gold or a gold alloy.

A disadvantage of this method is that the bump process is that it has a narrow process window. Furthermore, placement of the ball bumps is not very accurate.

Another disadvantage of the known method is that in case of stacking multiple dies, the pressure exerted on the dies when a further die is placed on top of a previous one, may have a damaging effect on the dies, especially when the dies are very thin.

SUMMARY OF THE INVENTION

It is an object of the present invention to provide a good method for aligning and bonding a first element and a second element, which alleviates or avoids the problems of the prior art.

It is a further object of the present invention to provide a good device wherein a first element and a second element have been aligned and bonded and wherein the disadvantages of the prior art are alleviated or avoided.

The above objects are accomplished by a method and device according to the present invention.

According to a first aspect of the invention a method for aligning and bonding a first element, the first element being a semiconductor device or substrate, and a second element is provided, the method comprising:
obtaining a first element having at least one protrusion, the protrusion having a base portion made of a first non-deformable material and an upper portion made of a second, deformable material, different from the first material;
obtaining a second element having a first main surface and a second main surface and at least one through-hole between the first main surface and the second main surface;
placing the first element and second element on one another;
receiving in the through-hole of the second element the protrusion of the first element, the protrusion being arranged and constructed so as to extend from an opening of the through-hole in the first main surface to a position beyond an opening of the through-hole in the second main surface;
deforming the deformable portion of the protrusion, such that the deformed portion mechanically fixes the second element onto the first element.

The base portion may be made of a non-deformable material. It is an advantage of embodiments of the present invention that the non-deformable portion maintains an overall stiffness of the connection and allows choosing where mechanical deformation of the protrusion occurs. In embodiments of the present invention, a deformation at the second element is preferred in order to maintain a pre-determined stand off between the through-hole and the non-deformable portion of the protrusion.

In embodiments of the present invention, the alignment accuracy of multiple stacked thin dies may be increased with respect to prior art methods. The deformable portion allows for self adjustment of the assembled device, coping with process tolerances related to the via diameter definition defined by the through-hole diameter definition, and overlay accuracy.

Self alignment/self positioning of the elements may be achieved in the claimed method and device and the alignment may be achieved for multiple levels of elements individually. Furthermore, a multiple element (die) assembly at room temperature is possible.

The protrusion(s) may be formed by any suitable fabrication process, for instance electroplating plating or physical vapour deposition, or surface and bulk micro machining. The protrusions may be provided by means of photolithography, and hence can be positioned very accurately. In case of a plurality of protrusions provided on the first element, the protrusions do not need to be aligned. In fact, the protrusions may be positioned at any suitable position on a same outer surface of the first element.

The first element may be a semiconductor die or substrate The second element may be semiconductor die or substrate or a membrane. The first element and the second elements may be semiconductor dies or substrates The assembly process between the two elements can be realised by means of collective substrate bonding (substrate on substrate or by placing dies or membranes onto the first element (in this case this is called die/membrane to die or die/membrane to wafer/substrate).

According to embodiments of the present invention the deformable portion of the protrusion is deformed so that part of the deformable portion extends on the second main surface of the second element so as to form a rivet securing the second element to the first element.

According to embodiments of the present invention the second element is an element provided with at least one contact on the second main surface, and deforming the deformable portion of the protrusion provides electrical contact between the protrusion and the contact. The mechanical fixing of the second element on the first element therefore enables at the same time electrical contact between the elements. In other words, stacking of multiple elements (for instance multiple thin dies) is performed such that they are mechanically fixed to each other as well as being in electrical contact, more specifically by means of the mechanical fixing. Looking at the same aspect from another viewpoint, in an aspect of the invention the stacking of multiple thin dies is performed such that they are electrically connected to each other and such that the means for providing electrical contact is also providing mechanical fixing of the first and the second to each other. The present invention is about front to front bonding of elements which are not positioned face to face.

According to embodiments of the present invention at least one spacer means is provided to keep a predetermined distance between the first element and the second element. The predetermined distance may be determined by dimensions of the at least one spacer means. The at least one spacer means may be positioned next to or adjacent the at least one protrusion, but may be positioned at other positions as well. The at least one spacer means may be provided on the first and/or second element. The number of spacer means may be equal to the number of protrusions, or may be a multiple thereof. However, the present invention is not limited thereto.

According to further embodiments the method may comprise providing a spacer means having a height smaller than the height of the protrusion. In embodiments of the present invention, the deformable part may be thicker than the spacer means. The spacer means may be arranged such that when the second element is placed on the first element for receiving the protrusion, the spacer means being provided on one of the first and the second element, and the other one of the first and the second element resting on the spacer means, the upper portion of the protrusion sticks out of the through-hole through the second main surface of the second element. In this way the deformation of the deformable portion of the protrusion can be accomplished easily, while keeping the elements at a predetermined mutual distance. The spacer means also reduces or removes the possible damaging effect of the pressure exerted when placing a first element on a second element. The spacer means may even be elastically deformable, such that it can compensate for a pressure exerted on the second element. Alternatively or additionally the deformable portion of the protrusion may take care of at least partially compensating for or absorbing the pressure exerted on the elements. Also a suitably shaped non-deformable base portion of a protrusion, for instance when (a part of) the base portion of the protrusion is wider than the through-hole in the second element, may act as a spacer, keeping the elements at a predefined mutual distance.

In embodiments of the present invention, an underfill, e.g. a polymer underfill, can be provided between the first and the second element. Such underfill can act as a damper towards excessive local pressure. In this way, potential stress concentration induced by the assembly may be relieved.

In a further embodiment the method comprises creating a freestanding portion of the second element by supporting the second element by spacer means and using the freestanding portion as a cantilever or bridge structure part of a MEMS device. This technique presents the advantage of creating a free-standing structure without having to perform a release process as known in the art, e.g. a wet or dry etching with post release treatment such as for example $CO_2$ drying. Release processes are being considered as a key challenge by the MEMS and NEMS community with respect to the selectivity of the release processes towards other materials.

According to further embodiments the method may comprise providing a protrusion having a non-deformable base portion that extends up until the level of the second main surface of the second element when the first and second element are aligned and ready for being bonded. The non-deformable base portion may extend up until the level of the second main surface of the second element, either in a situation wherein a gap exists between the upper main surface of the first element and the lower main surface of the second element or in the situation wherein the lower main surface of the second element is placed directly on the upper main surface of the first element.

Deforming the deformable portion may be performed by pressing the deformable portion with a predetermined pressure against a predetermined surface, which corresponds to pressing a predetermined surface against the protrusion. Deforming may furthermore or alternatively comprise melting, soldering or welding the deformable portion.

In some embodiments the deforming of the upper part of the protrusion(s) is caused by a heat treatment. Additionally or alternatively the deforming of the protrusion(s) may be caused by a pressure treatment. The deformable upper portion may become deformable only when heated and/or when pressure is applied on it. This facilitates the receipt of the protrusion in the through-hole and reduces the risk of spilling material of the deformable portion when entering the through-hole.

In further embodiments the deforming of the upper, deformable portion is performed by applying a predetermined pressure on the deformable portion using a predetermined surface, for instance a first surface of a third element, wherein the third element may comprise electrical contacts or an electrical interconnect in a through hole, the electrical contacts or the electrical interconnect being aligned with the deformable portion.

In further embodiments the method comprises heating the first surface of the third element.

When semiconductor material surfaces and protrusion materials, e.g. metal, are heated and thereafter cooled down, the protrusion clamps the surface of the semiconductor material; in particular it clamps the surface of the second element down to the first element. This phenomenon is attributed to the CTE mismatch between metallic materials and the semiconductor materials of the first, second and third elements, that are typically Si or polymer based.

The third element may be another substrate or die and can be left in place after the deformation step. Protrusions may be formed on the third element to align and bond it to a further element. Alternatively the third element may be removed. After removal of the third element, further protrusions may be formed on top of the second element for allowing further stacking of other elements. This process can be repeated.

In further embodiments the method may comprise providing the second main surface of the second element locally with a predetermined metal portion and welding the metal portion with the deformed portion of the protrusion. Welding may be provided to ensure proper electrical connection between the first surface of the first element and the second surface of the second element. The metal portion may be identical to the electrical contact mentioned earlier, but may alternatively be provided separately or be provided instead of the contact.

In further embodiments the method may comprise circulating cooling fluid, e.g. cooling liquid, in the space in between the first element and the second element so as to provide for micro-fluidic cooling of the elements. The dimensions of the space between consecutive elements in a stack may for instance be determined by the configuration of the spacer means and/or by the configuration of the protrusion(s). In the space or gap fluid may flow, the fluid transporting the heat dissipated by the electronic components on the elements and thereby cooling the elements.

Embodiments of the present invention include repeating the aligning and bonding steps for an additional element taking the place of the second element, to be aligned and bonded with an already formed stack provided with protrusions, this stack taking the place of the first element.

According to another aspect, the present invention provides a semiconductor device, comprising a first element and a second element aligned and bonded to the first element. The device comprises:
a first element comprising at least one protrusion, the first element being a semiconductor die or substrate, the protrusion having a base portion made of a first, non-deformable material and an upper portion made of a second, deformable material, different from the first material;
a second element having a first and a second main surface and at least one through-hole between the first and second main surface, the through-hole having received the protrusion, the protrusion extending from the opening of the through-hole in the first main surface to a position beyond the opening in the second main surface and the deformable portion of the protrusion being deformed so as to mechanically fix the first element on the second element. In embodiments of the present invention the base portion of the protrusion is made of an essentially rigid, non-deformable material, for instance comprising copper, while the upper portion is made of a non-rigid, deformable material, for instance comprising gold and/or Sn. Cu or W are a rather stiff materials and can be used as the non deformable part, Au and Sn are softer and can be used as the deformable portion as well as solder materials.

The protrusion provides self adjustment with regard to the through-hole of the second element, and mechanical clamping of the first element to the second element. In embodiments of the present invention, the first element may be a die or a substrate and the second element may be a die, a substrate or a membrane.

In embodiments of the invention the second element may be an element provided with at least one contact on the second main surface, wherein the deformed portion of the protrusion provides electrical contact between the protrusion and the contact so that the first and second element may easily be electrically connected.

In embodiments of the present invention, the hole in the second element is a through-hole, extending through the second element, the second main surface being the front surface of the second element.

In an embodiment of the present invention the through-hole or a part of the through-hole essentially tapers inwardly from the proximal end of the through-hole at the first main surface to the distal end of the through-hole at the second main surface of the second element. The tapered through-hole, or, more specifically, the sloped via, helps the self-alignment of the elements of the device. In practice a slope angle ($\alpha$) may vary between about 0 and 70 degrees, for example between 5 and 15 degrees. In a preferred embodiment the angle is about 5 degrees.

In embodiments of the invention the gap between the outer surface of the protrusion and the inner surface of the through-hole (in case of a tapered through-hole, the gap at the narrowest part of the through-hole) is provided having a width of less than 2 micron. The width of the gap between the outer surface of the protrusion and the inner surface of the through-hole is determined by the overlay accuracy of a mask-aligner used. Using more advanced equipment a smaller gap can be achieved (~50 nm).

In embodiments of the present invention the device comprises at least one spacer means, optionally positioned next to or adjacent, the protrusion(s) to keep a predetermined distance between the first element and the second element. The spacer means may for instance be made of polymer spring material, such as BCB, silicone, PBO, polyimide, epoxy. In that case the spacer means is made to be elastically deformable so that it can compensate for a pressure exerted onto the second element.

In a further embodiment of the present invention, the semiconductor device comprises a cooler for circulating cooling liquid in the space between the first element and the second element.

In further embodiments the base portion of the protrusion extends to more than 50 nm below the second main surface of the second element, when the second element is placed on the first element.

In embodiments of the invention the stacking of multiple thin dies is performed such that the dies are positioned top to top. This is of particular interest when stacking more than two elements, preferably with always a same distance between the top surfaces of the elements. This moreover facilitates the alignment process, since top surfaces contain frequently the alignment structure and are therefore visible.

Particular and preferred aspects of the invention are set out in the accompanying independent and dependent claims. Features from the dependent claims may be combined with features of the independent claims and with features of other dependent claims as appropriate.

Although there has been constant improvement, change and evolution of devices in this field, the present concepts are believed to represent substantial new and novel improvements, including departures from prior practices, resulting in the provision of more efficient, stable and reliable devices of this nature.

BRIEF DESCRIPTION OF THE DRAWINGS

The following detailed description of embodiments of the present invention will be better understood when read in conjunction with the appended drawings. Further characteristics, advantages and details of the present invention will become apparent from this description. Furthermore, it is to be understood that the present invention is illustrated by way of example only and is not limited by the accompanying figures, in which like reference numbers indicate similar elements.

In the description reference is made to the annexed drawings 1-10, that show views in cross-section illustrating.

DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Furthermore, the terms first, second, third and the like in the description and in the claims, are used for distinguishing between similar elements and not necessarily for describing a sequential or chronological order. For instance, if a first element is described as being placed on a second element, it is to be understood that this also encompasses the second element being placed on the first element. More generally, it is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein. Furthermore, the terms die, wafer, substrate, membrane and the like in the description are used for descriptive purposes and are examples of the first element and second element defined in the appended claims.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

FIGS. 1-10 show respective steps in a method for aligning and bonding the elements of a semiconductor device 3 according to embodiments of the present invention, as well as devices thus obtained.

In the figures is shown a semiconductor die 1 (i.e. a first element) on which a membrane or another die 2 (i.e. a second element) is to be mounted. At least the first element 1 is a semiconductor die or substrate. First of all the second die 2 to be mounted is thinned down and a membrane and/or a die having a suitable shape and dimensions is thus formed, for instance a die with a thickness of 5 µm to 30 µm, for example about 15 µm. As from a thickness of 15 µm, the die is thick enough to be handled properly without compromising mechanical integrity. During the thinning step, a deep reactive ion etch technique may be used to singulate dies. This step also allows forming through-holes into the dies. In order to be grinded, the die 2 is mounted on a carrier 4. The carrier 4 can be specifically designed for the die 2 in the sense that the carrier 4 is able to keep the die 2 directly in place during the manufacturing of a semiconductor device comprising a stack of the first element and the second element. Alternatively, the carrier 4 is of a more universal type and uses glue or similar technique to hold the die 2 in place. In the latter case the glue layer 5 may have a thickness ranging from 1 µm to 20 µm, for example about 5 µm. A layer of glue with a thickness of about 5 µm allows for sufficient deformation during the assembly process. A thickness of about 5 µm is what is typically achieved with glue materials presents on the market.

At a moment in time, e.g. during the thinning step, one or more openings or through-holes 6 are formed in the die 2. A through-hole may have any shape and dimensions. In the shown embodiment, the through-hole is tapered inwardly so that the hole has a wide opening at a back surface or first main surface 7 and a narrow opening at a front surface or second main surface 8 of the die 2. However, the present invention is not limited to second elements having tapered or conical through-holes. In case of tapered through-holes, the angle ($\alpha$) between the direction of the tapering of the hole and a direction perpendicular to the second main surface 8 may vary from 0 to 70 degrees, and for example amounts to about 5 degrees. The sloped shape of the hole, more specifically the conical shape in some of the embodiments of the invention, facilitates the alignment of the dies.

Figure 1:
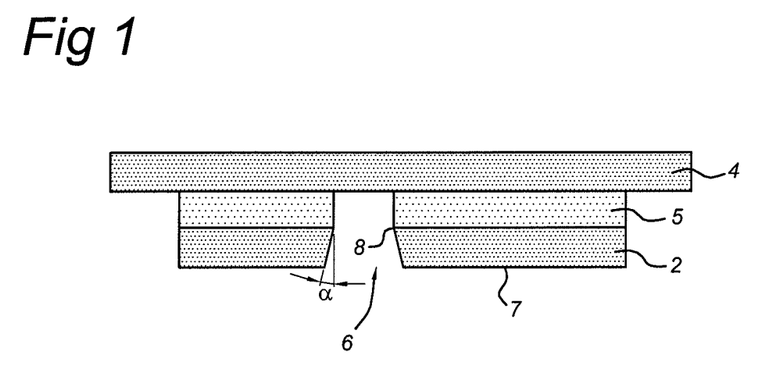
FIG. 1 a view in cross-section of a first embodiment of a die or wafer to be mounted.
Figure 2:
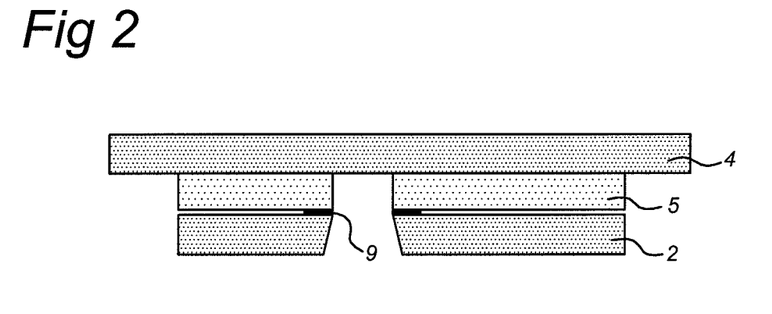
FIG. 2 a view in cross-section of a second embodiment of a die or wafer to be mounted.

In an embodiment of the invention the front side of the die 2, i.e. the second main surface comprises a conductive pattern, e.g. a metallisation pattern, for instance provided with solder material (Sn, Au, . . . ). The conductive pattern may be such that it is provided at the second main surface of the second element, around the through-hole. The conductive pattern, e.g. metal, may form one or more contact areas 9 for providing an electrical connection between the second die 2 and the first die 1, as will be explained hereafter. This way, a front to front connection may be obtained between two elements 1, 2 which are not placed face to face. An example of an embodiment of a second element 2 provided with a conductive pattern around the through-hole at the second surface 8 of the second element is shown in FIG. 2.

In embodiments of the present invention the back surface 8 of the die 2 and possibly also the side surfaces are passivated, while in other embodiments the passivation process of the die may be omitted.

Figure 3:
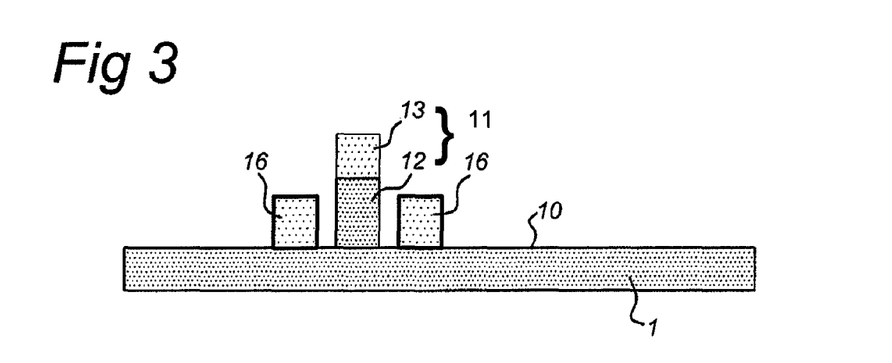
FIG. 3 a view in cross-section of a first embodiment of a receiving die or wafer.
Figure 4:
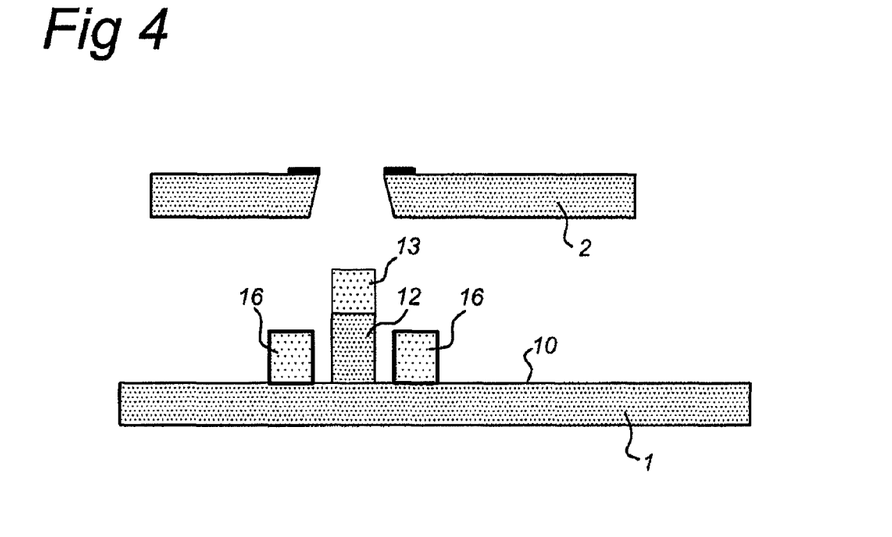
FIG. 4 a view in cross-section of both a die or wafer to be mounted and a receiving die or wafer according to another embodiment, in an initial stage of the bonding operation.

FIG. 3 illustrates another part of a semiconductor device 3 to be formed. The figure shows a semiconductor die 1, first element, for example placed on a chuck (not shown). On the die 1 a dielectric may be patterned. The semiconductor material, e.g. Si, can be exposed by various thinning processes. A dielectric allows isolating the various semiconductor elements that can be present without using other isolation techniques. The die 1 may not be fully cured and may optionally be fully cured during the final assembly of the device. Curing may be performed to enhance overall mechanical stability of the assembly.

On front surface 10 of the semiconductor die 1 one or more protrusions or plugs 11 are formed. These protrusions or plugs 11 are present on the semiconductor die 1 before aligning and bonding the first element to the second element.

The plug or protrusion 11 comprises a base portion 12 and an upper portion 13. The base portion 12 is close to the substrate and the upper portion 13 is essentially on top of the base portion 12, i.e. on the average at a larger distance to the substrate when compared to the base portion 12.

After receiving the protrusion 11 of the first element 1 in the through hole 6 of the second element 2, the upper portion 13 of the protrusion 11 is deformed such that the deformed portion mechanically fixes the second element 2 on the first element 1. To deform the upper portion 13, a force is applied. The base portion is not deformed upon applying this force. Essentially, the plug 11 comprises a rigid base portion 12 or a non-deformable portion or rigid part 12 (for instance made of rigid metal, such as e.g. Cu) at the bottom and a deformable upper portion 13 or a deformable part 13 (for instance made of soft metal, such as e.g. Au, In and/or Sn)) on top.

To In order not to break the first and second element, the force cannot be too high. The materials of the upper and lower portion can be chosen such that the upper portion is deformed upon applying this force and the lower portion is not deformed upon applying this force. Essentially the deformable portion is made of a deformable material that deforms upon applying a force and the non-deformable portion is made of a non-deformable material or rigid material that does not deform upon applying this force.

In a $1^{st}$ order assessment the rigid material has Young's modulus E >100 GPa and tensile strength >200 MPa, while deformable material has Young's modulus E <100 MPa and tensile strength <150 MPa. In embodiments of the invention the plug 11 may at least partly be made of metal and can then be formed by an electro plating process or any other suitable technique. Plug 11, however, is not restricted to a double metal composition. It can for example have any of W, Ni, Pt, Pd as rigid material, and any of Au, Sn, In as deformable material. It may have any suitable composition, for instance may comprise a composite layer for any of the rigid or the deformable parts. In embodiments of the invention the plug 11 is at least partly deformable. The deformable part may optionally be solderable.

An advantage of providing a protrusion with two different portions, a deformable and a non-deformable one, is that the assembly process (see below) will have a wide process window by playing with the respective height of the two parts. The height of the non-deformable part of the protrusion may determine the stand-off between the two elements to be connected to one another.

In a further processing step the first die 1 and second die 2 are presented in front of each other (cf. FIG. 4; carrier 4 not shown) and a rough alignment is performed, for instance by a flip-chip technique which is as such known in the art. By changing the chip temperature it is possible to change the viscosity of the glue 5 between the carrier 4 and the second element 2. When the glue 5 becomes more liquid it is easing the self alignment process, see FIG. 7. The protrusion 11 is being guided by the hole 6 independently from the final flip chip machine accuracy because the second elements 2 can move independently from the flip chip machine.

Figure 5:
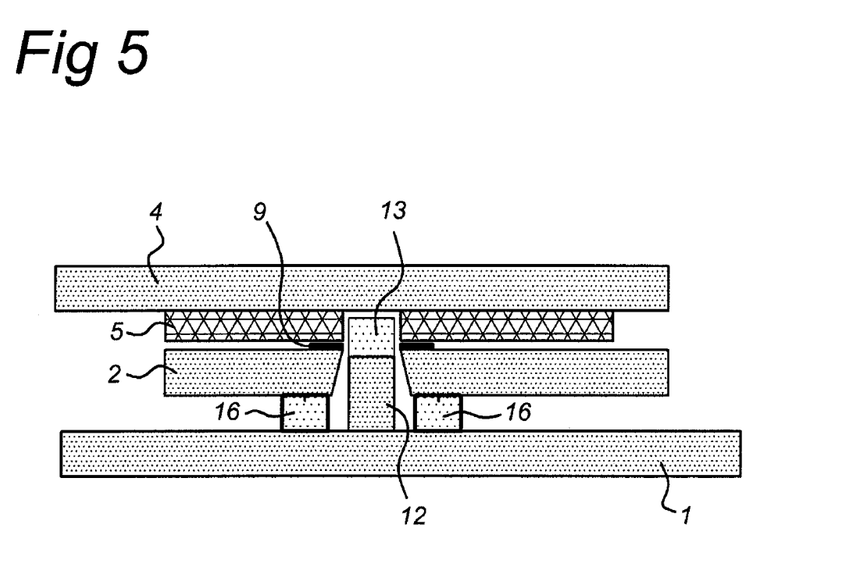
FIG. 5 a view in cross-section of a die or waver to be mounted and a receiving die or wafer in a further stage of the bonding operation.

Then the one or more plug(s) 11 of the first die 1 are inserted into the corresponding through-hole(s) 6 of the second die 2, as is shown in FIG. 5. After insertion of the plugs 11, the carrier 4 of the second (thin) die 2 may be taken away from the second die 2 and subsequently the glue 5 present on at least parts of the second die 2 may be removed. A polymer of the receiving die may then be fully cured, thus offering superior gluing properties compared to the uncured material.

Figure 6:
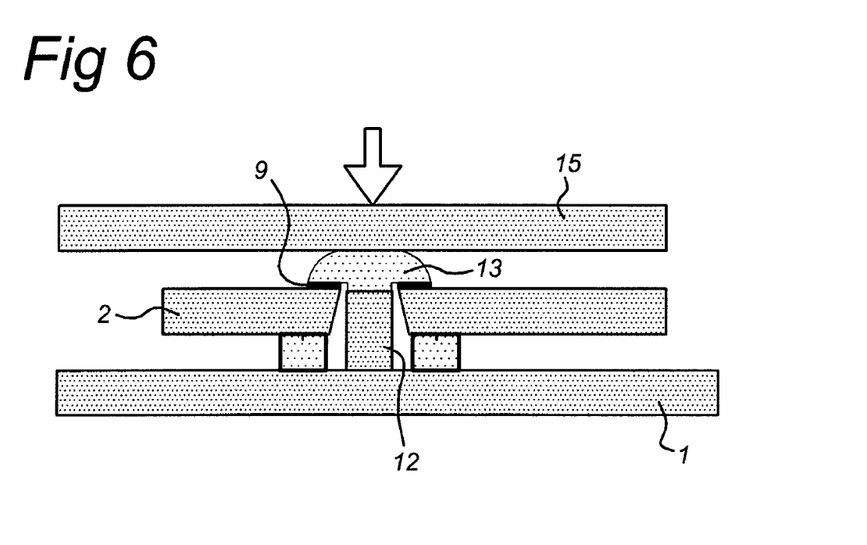
FIG. 6 a view in cross-section of the embodiment of FIG. 5, after removal of the carrier and the glue layer and illustrating an embodiment of the riveting operation according to embodiments of the present invention.

After the plugs 11 of the first die 1 have been inserted into the corresponding through-holes 6 of the second die 2 and after removal of the carrier 4 and the glue layer 5 from the second die 2, both dies 2, 1 are bonded to one another by applying a mechanical force (compression) to the upper, deformable portion of the plug(s) 11 sticking out of the second main surface 8 of the second die 2, as is shown in FIG. 6. The mechanical force may be provided by a separate tool 15 (only schematically shown in FIG. 6) that is brought into contact with upper, deformable portion(s) 13 of the plug(s) 11. The tool is pressed against the plug 11, which forms a rivet from the plug. The rivet locks the second die 1 firmly in place and a reliable and strong "front-to-front" connection of the two elements 1, 2 (compared to a "face-to-face" connection) is accomplished.

Instead of a applying a mechanical compression force to the plug or in addition to this, the upper portion 13 of the plug 11 may be deformed by a thermal treatment technique including, but not limited to, thermo-sonic, thermo-compression, ultrasonic, laser or reflow bonding techniques.

Figure 7:
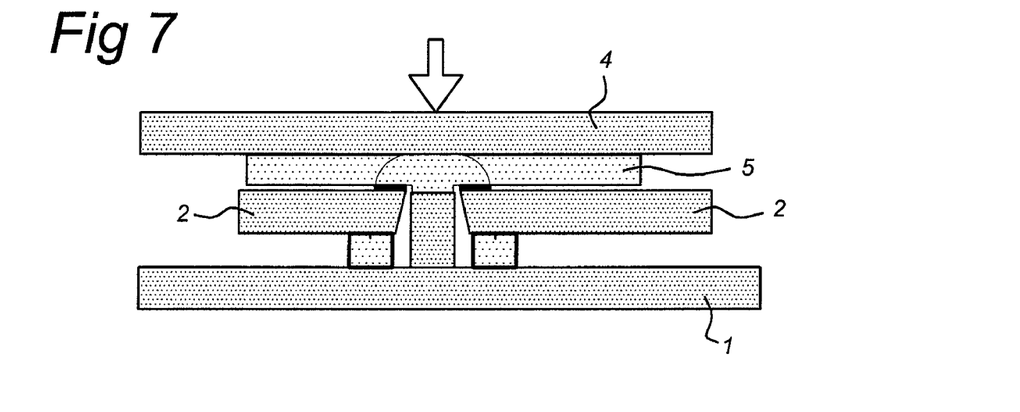
FIG. 7 a view in cross-section of the embodiment of FIG. 5, illustrating another embodiment of the riveting operation.

In another embodiment, shown in FIG. 7, the operations of placing die 2 onto die 1 and forming the rivet may be combined. After inserting the plug(s) 11 into the corresponding through-hole(s) 6 by lowering the carrier 4 and the die 2 attached to the carrier 4, the carrier 4 and glue layer 5 are not removed immediately from the second die 1. Deforming the upper portion 13 of the plug(s) 11 now is accomplished by having the surface of the carrier 4 facing the one or more plugs 11 to exert sufficient force on the plugs so that the upper portion thereof is properly deformed to provide the bonding.

In case the second surface 8 of the second die 2 has been provided with contact areas 9, the upper portion 13 of the plug may be deformed such that it contacts to the contact areas 9 and thus provides an electrical connection through the plug 11 between the upper and lower die 1, 2. Once the rivet is formed, the deformed upper portion 13 of the plug 11 may be welded to the second die 2.

Figure 8:
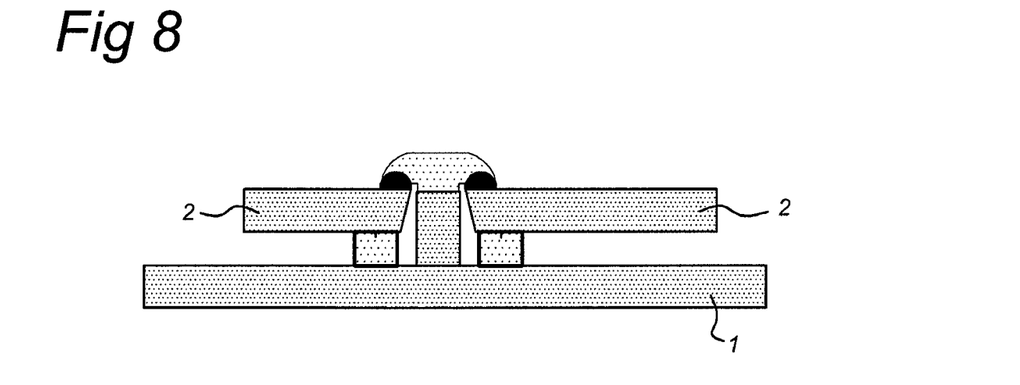
FIG. 8 a view in cross-section of a further embodiment of a semiconductor device according to the invention.
Figure 9:
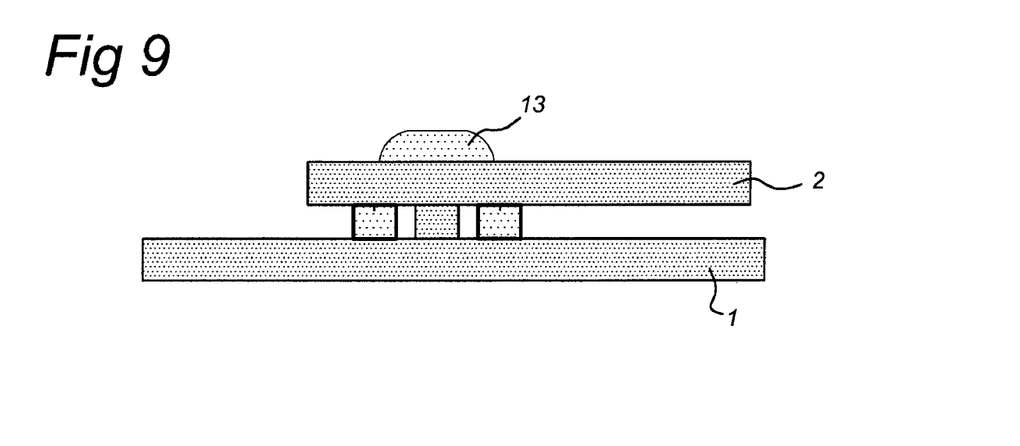
FIG. 9 a view in cross-section of a further embodiment of a semiconductor device according to the present invention having a freestanding portion.

FIG. 8 shows welded portions 17 wherein the plug 11 is welded to the contact elements 9 previously provided on the second main surface 8 of the die 2. If proper materials, e.g. metal have been chosen (for instance Sn, In, Au, Ni, Cu, Co), the welding may be performed by a thermal treatment of the rivet. In this embodiment electrical contact between the plug and the die 2 is further improved.

In the embodiments shown in FIGS. 3 to 10, two spacer elements 16 are shown, formed on the front surface 10 of the first die 1. The spacer elements 16, in the embodiment illustrated, are positioned in the neighbourhood of the plug 11 and are provided to keep a predetermined distance between the dies 1, 2. The spacer elements 16 may be made of (semi) rigid material. They may not only serve to keep the dies 1, 2 at a suitable mutual distance, but also avoid damage to the dies and the plug 11, for instance when a compression force is applied on the deformable portion 13 of the plug 11.

In certain embodiments of the invention, the height of the spacer elements 16 is smaller then the height of the plugs 11. When the second die 2 is placed onto the first die 1, the second die 2 rests on the spacer elements 16 (in embodiments where the spacer elements are provided on the first die 1; in other embodiments the spacer elements 16 can be provided on the second die 2) and receives the plug 11. The upper portion 13 of the protrusion 11 sticks out of the through-hole 6 through the second main surface 8 of the die 2. This makes it easier to apply a compression force on the plug 11 needed to properly deform the plug 11 to form a rivet.

In embodiments of the present invention, the spacer elements 16 may be elastically deformable so as to at least partly compensate for the pressure exerted. The elastically deformable spacer elements 16 may be made of spring material, such as for example polymer spring material. Examples of spring material may be BCB, silicone, PBO, polyimide, epoxy, nano-engineered materials (filaments type). The material, e.g. polymer material, of the spacer elements 16 may be deformable in order to comply to the mechanical stress and to act as a spring for the final assembly. In the embodiments wherein spacer elements 16 are omitted, the deformable upper portion 13 of the plug 11 may on its own act as a spring for mechanical compliance.

The second die 2 may be supported on one or more spacer elements 16 such that a freestanding portion of the die 2 is formed. In the embodiment shown in FIG. 9 the second die 2 forms a projecting member supported at one end, wherein the projecting member can be used as a cantilever or bridge structure part, for instance of a MEMS device.

In another embodiment (not illustrated in the drawings) the device 3 comprises a cooler for circulating cooling liquid in the space between the first die 1 and second die 2 so that the semiconductor device 3 may easily be cooled during operation thereof.

Figure 10:
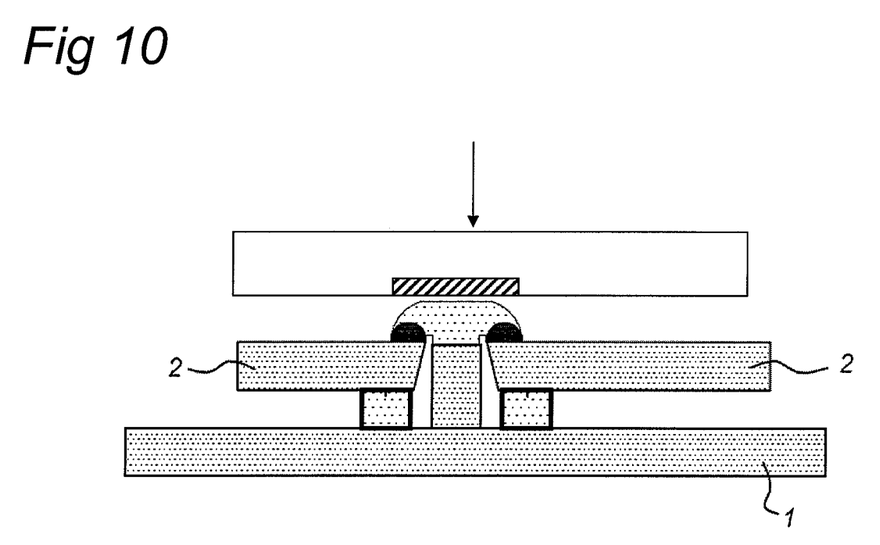
FIG. 10 a view in cross-section of a further embodiment of a semiconductor device according to the present invention, wherein a third element is provided, the third element having electrical contacts.

In yet a further embodiment, illustrated in FIG. 10, pressure is exerted on the deformable portion of the protrusion by means of a third element, the third element comprising an electrical interconnect. The third element and the protrusion are positioned and aligned with respect to one another so that the electrical interconnect is aligned with the deformable portion of the protrusion. By deforming the deformable portion, e.g. under pressure, an electrical connection may be made between the deformable portion and the electrical interconnect on the third element. At the same time, by deforming the deformable portion, an electrical connection may be made between the deformable portion and the second surface of the second element. To enhance the electrical and/or mechanical connections, the deformable portion of the protrusion may furthermore be welded to the second surface of the second element and/or to the electrical interconnect of the third element.

In embodiments of the present invention, the predetermined surface which may be used for deforming the deformable portion of the protrusion may have a predetermined shape, so as to mould the deformable material to that predetermined shape when deforming the deformable portion.

Although the invention has been described with reference to specific embodiments, specific constructions and configurations, as well as materials, thereof, it will be appreciated that invention is not limited to these embodiments and that changes and modifications to the system and method described herein may be made without departing from the scope of the invention as defined by the appended claims.

The invention claimed is:

1. A method for aligning and bonding a first element and a second element, the first element being a semiconductor die or substrate, the method comprising:
   obtaining a first element having at least one protrusion, the protrusion having a base portion made of a first non-deformable material and an upper portion made of a second, deformable material, different from the first material;
   obtaining a second element having a first main surface and a second main surface and at least one through-hole between the first main surface and second main surface;
   placing the first and second element onto one another;
   receiving in the through-hole of the second element the protrusion of the first element, the protrusion being arranged and constructed so as to extend from an opening of the through-hole in the first main surface to a position beyond an opening of the through-hole in the second main surface;
   deforming the upper portion of the protrusion, such that the deformed portion mechanically fixes the second element on the first element.

2. A method according to claim 1, wherein the deformable portion of the protrusion is deformed so that part of the deformable portion extends on the second main surface of the second element so as to form a rivet securing the second element to the first element.

3. A method according to claim 1, wherein the second element is an element provided with at least one contact on the second main surface, and wherein deforming the deformable portion of the protrusion provides electrical contact between the protrusion and the contact.

4. A method according to claim 1, further comprising providing at least one spacer means to keep a predetermined distance between the first element and the second element.

5. A method according to claim 1, further comprising providing a spacer means having a height smaller than the height of the protrusion and being arranged such that when the second element has received the protrusion, both the first and second element being in contact with the spacer means, the upper portion of the protrusion sticks out of the through-hole through the second main surface of the second element.

6. A method according to claim 4, wherein the spacer means is elastically deformable, such that it can compensate for a pressure exerted on the second element.

7. A method according to claim 1, comprising positioning the protrusion within a first predetermined precision level.

8. A method according to claim 7, wherein the first predetermined precision level is smaller than 0.4 micron.

9. A method according to claim 1, comprising positioning the through-hole in the element within a second predetermined precision level.

10. A method according to claim 9, wherein the second predetermined precision level is smaller than 100 nm.

11. A method according to claim 7, wherein the combined precision level of the first precision level and the second precision level is smaller than 2 micron.

12. A method according to claim 1, comprising providing a protrusion having a base that extends up until the level of the second main surface of the second element.

13. A method according to claim 1, wherein deforming the deformable portion includes a heat treatment.

14. A method according to claim 1, wherein deforming the deformable portion includes a pressure treatment.

15. A method according to claim 1, wherein deforming the deformable portion is performed by applying a predetermined pressure on the deformable portion using a predetermined surface.

16. A method according to claim 1, wherein the predetermined surface is a first surface of a third element and the third element comprises an electrical interconnect, the electrical interconnect being aligned with the deformable portion.

17. A method according to claim 16, comprising heating the first surface of the third element.

18. A method according to claim 16, providing the first surface of the predetermined surface having a predetermined shape and moulding the deformable material with the first surface.

19. A method according to claim 1, comprising providing the second main surface of the second element locally with a predetermined metal portion and welding the metal portion with the deformed portion of the protrusion.

20. A method according to claim 1, comprising creating a freestanding portion of the second element by supporting the second element by spacer means and using the freestanding portion as a cantilever or bridge structure part of a MEMS device.

21. A method according to claim 1, further comprising circulating cooling fluid in the space in between the first element and the second element.

22. A method according to claim 1, further comprising repeating the method for aligning and bonding one or more elements on the second or further element.

* * * * *